(12) United States Patent
Kousai

(10) Patent No.: US 8,565,341 B2
(45) Date of Patent: Oct. 22, 2013

(54) POWER AMPLIFIER AND SEMICONDUCTOR INTEGRATED CIRCUIT

(75) Inventor: Shouhei Kousai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 501 days.

(21) Appl. No.: 12/886,699

(22) Filed: Sep. 21, 2010

(65) Prior Publication Data

US 2011/0235689 A1    Sep. 29, 2011

(30) Foreign Application Priority Data

Mar. 24, 2010  (JP) .................................. 2010-67752

(51) Int. Cl.
  *H04K 1/02*    (2006.01)
(52) U.S. Cl.
  USPC ........... 375/297; 375/296; 375/295; 375/216; 330/285; 330/51; 330/295
(58) Field of Classification Search
  USPC ........... 375/297, 296, 295, 216; 330/285, 51, 330/295
  See application file for complete search history.

(56) References Cited

U.S. PATENT DOCUMENTS

| | | | | |
|---|---|---|---|---|
| 6,049,703 | A | * | 4/2000 | Staudinger et al. ......... 455/114.3 |
| 6,147,665 | A | * | 11/2000 | Friedman ..................... 345/75.2 |
| 7,391,261 | B2 | | 6/2008 | Dittmer |
| 7,518,445 | B2 | | 4/2009 | Woo et al. |

FOREIGN PATENT DOCUMENTS

JP    2006-203456    8/2006

\* cited by examiner

*Primary Examiner* — Zewdu Kassa
(74) *Attorney, Agent, or Firm* — White & Case LLP

(57) ABSTRACT

In general, according to one embodiment, a power amplifier includes an envelope detector, a limiter, and a combiner. The envelope detector is configured to sense an envelope component of an input signal. The limiter includes a PMOS (Positive channel Metal Oxide Semiconductor) transistor and an NMOS (Negative channel Metal Oxide Semiconductor) transistor. The PMOS transistor is configured to sense a phase component of the input signal. The phase component has a second-order distortion controlled within a predetermined range with respect to the input signal. The NMOS transistor is configured to sense a phase component of the input signal. The phase component has the same second-order distortion as the phase component sensed by the PMOS transistor. The combiner is configured to combine the envelope component sensed by the envelope detector and the phase component sensed by the limiter to generate an output signal.

7 Claims, 10 Drawing Sheets

US 8,565,341 B2

POWER AMPLIFIER AND SEMICONDUCTOR INTEGRATED CIRCUIT

CROSS REFERENCE TO RELATED APPLICATIONS

This application is based upon and claims the benefit of priority from the prior Japanese Patent Application No. 2010-67752, filed on Mar. 24, 2010, the entire contents of which are incorporated herein by reference.

FIELD

The present invention relates to a power amplifier and a semiconductor integrated circuit.

BACKGROUND

An EER (Envelope Elimination and Reconstruction) system is adopted in an ordinary power amplifier that supplies an electric power to the radio communication device (see JP-A No. 2006-203456 (Kokai)). In the EER system, an envelope component of an input signal is processed by an envelope detector, and a phase component (hereinafter referred to as "input phase") of the input signal is processed by a limiter. The limiter shifts the input phase using an AM-PM (Amplitude Modulation-Phase Modulation) conversion method to generate a phase component (hereinafter referred to as "output phase") of an output signal.

However, in the EER system disclosed in JP-A No. 2006-203456 (Kokai), a degree of AM-PM conversion increases with increasing range (input amplitude range) of amplitude (hereinafter referred to as "input amplitude") of the input signal. Particularly, in an OFDM (Orthogonal Frequency Division Multiplexing) system, the degree of AM-PM conversion increases because of the wide input amplitude range (about 40 dB). Additionally, an allowable range of the degree of AM-PM conversion is comparatively narrow in the EER system disclosed in JP-A No. 2006-203456 (Kokai). Accordingly, the EER system disclosed in JP-A No. 2006-203456 (kokai) cannot be applied to the OFDM-system radio communication device having the wide input amplitude range.

DETAILED DESCRIPTION

Embodiments will now be explained with reference to the accompanying drawings.

In general, according to one embodiment, a power amplifier includes an envelope detector, a limiter, and a combiner. The envelope detector is configured to sense an envelope component of an input signal. The limiter includes a PMOS (Positive channel Metal Oxide Semiconductor) transistor and an NMOS (Negative channel Metal Oxide Semiconductor) transistor. The PMOS transistor is configured to sense a phase component of the input signal. The phase component has a second-order distortion controlled within a predetermined range with respect to the input signal. The NMOS transistor is configured to sense a phase component of the input signal. The phase component has the same second-order distortion as the phase component sensed by the PMOS transistor. The combiner is configured to combine the envelope component sensed by the envelope detector and the phase component sensed by the limiter to generate an output signal.

Figure 1:
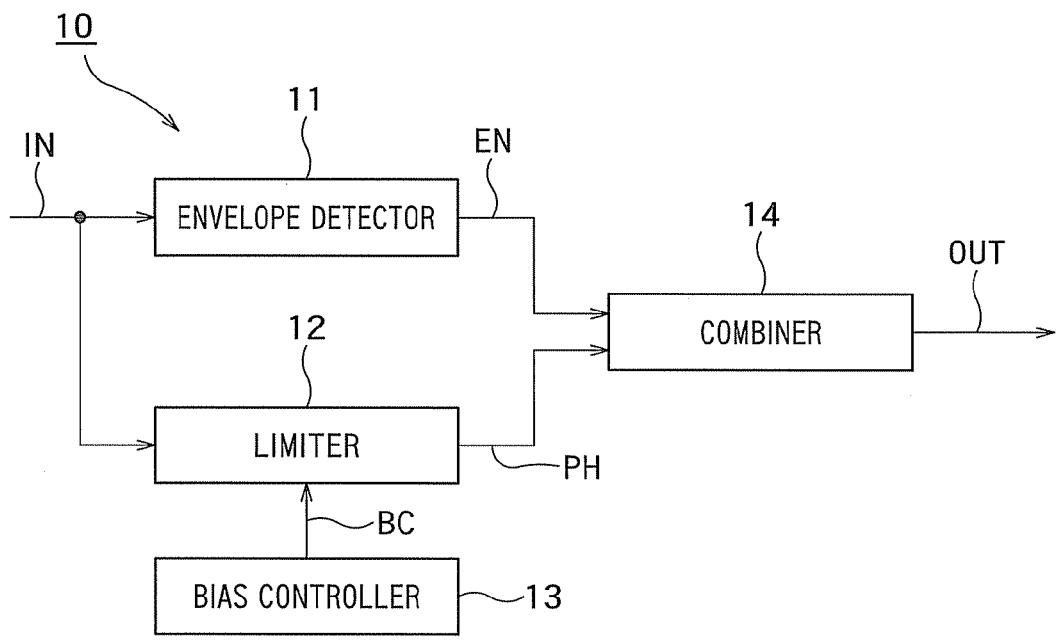
FIG. 1 is a block diagram illustrating a configuration of a power amplifier 10 of the embodiment.
Figure 13:
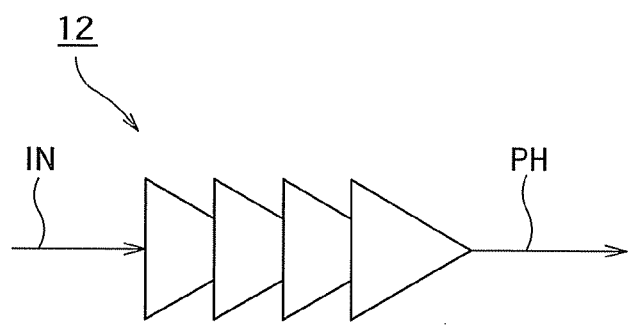
FIG. 13 is a schematic diagram illustrating a configuration of a limiter 12 of FIG. 1.

A configuration of a power amplifier according to an embodiment will be explained below. FIG. 1 is a block diagram illustrating a configuration of a power amplifier 10 of the embodiment. FIG. 13 is a schematic diagram illustrating a configuration of a limiter 12 of FIG. 1.

Referring to FIG. 1, the power amplifier 10 includes an envelope detector 11, the limiter 12, a bias controller 13, and a combiner 14.

The envelope detector 11 of FIG. 1 senses an envelope component of an RF (Radio Frequency) input signal IN and outputs a signal (hereinafter referred to as "envelope signal") EN having the sensed envelope component.

The limiter 12 of FIG. 1 outputs a signal (hereinafter referred to as "phase signal") PH having a phase component of the RF input signal IN and a constant amplitude based on the RF input signal IN. The limiter 12 is operated based on a bias control signal BC generated by the bias controller 13. More specifically, while maintaining the phase component, the limiter 12 converts the input signal IN such that the amplitude is kept constant, whereby the limiter 12 generates the phase signal PH and outputs the generated phase signal PH. Referring to FIG. 13, the limiter 12 includes plural amplifiers. The amplifiers are cascaded. The amplifiers of the limiter 12 are explained below with reference to FIGS. 2 and 3.

The bias controller 13 of FIG. 1 controls a bias (bias current or bias voltage) of the limiter 12. The detailed bias controller 13 is explained below with reference to FIG. 5.

The combiner 14 of FIG. 1 combines the envelope component (envelope signal EN) sensed by the envelope detector 11 and the phase component (phase signal PH) sensed by the limiter 12 to generate an RF output signal OUT by combining.

Figure 2:
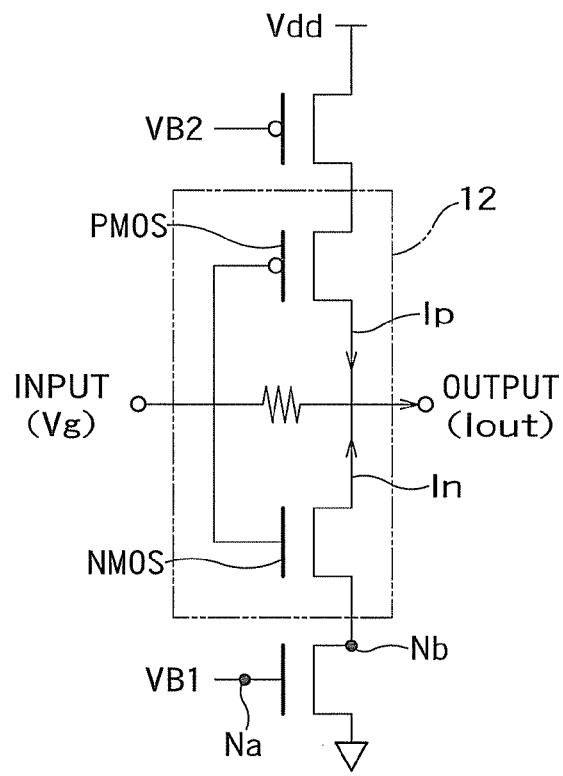
FIG. 2 is a circuit diagram illustrating a single-layer amplifier type limiter of a first example of the limiter 12 of FIG. 1.
Figure 3:
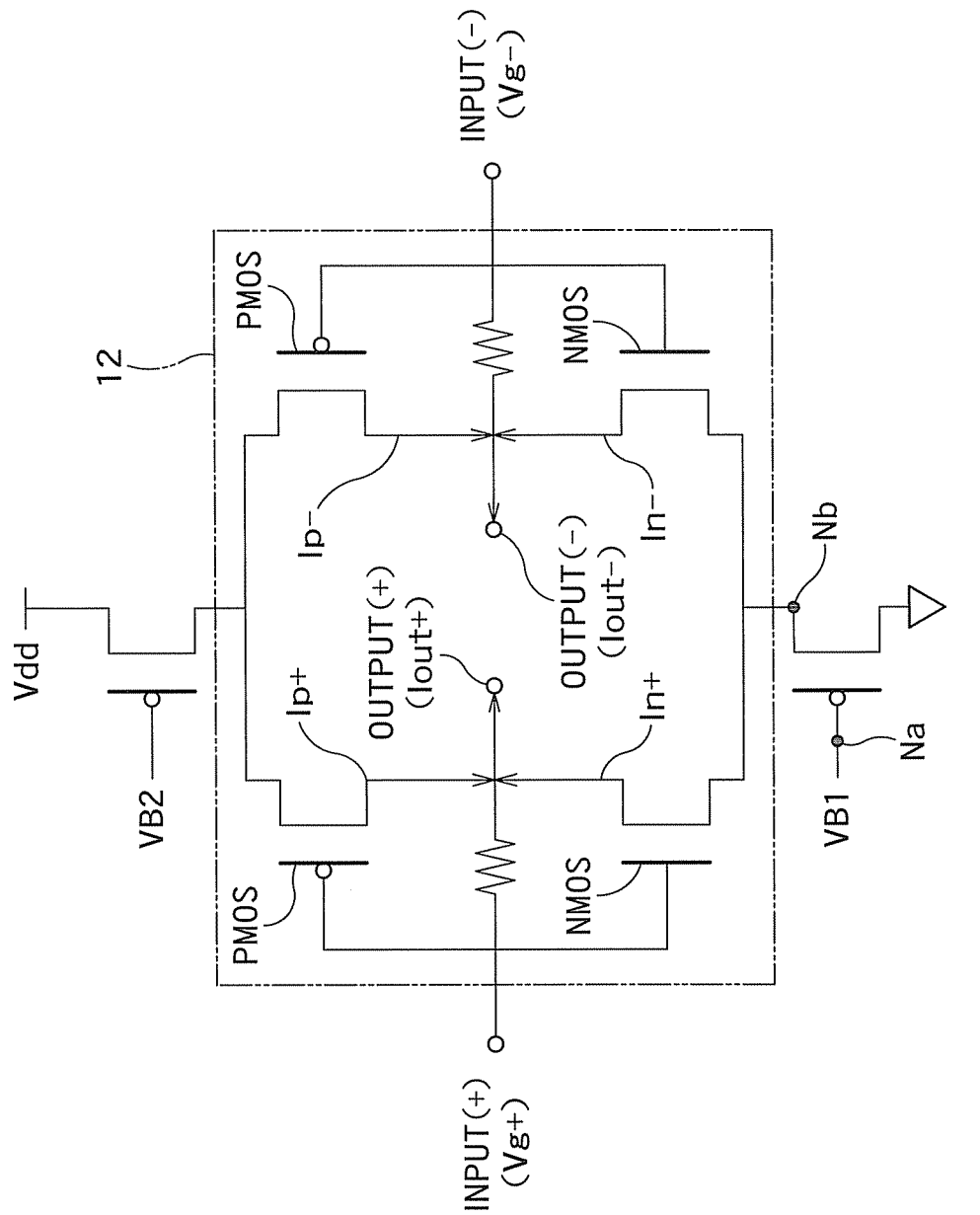
FIG. 3 is a circuit diagram illustrating a differential amplifier type limiter of a second example of the limiter 12 of FIG. 1.

The amplifiers of the limiter 12 of FIG. 1 will be explained. There are two kinds of configurations of the limiter 12 (see FIGS. 2 and 3). FIG. 2 is a circuit diagram illustrating a single-layer amplifier type limiter of a first example of the limiter 12 of FIG. 1. FIG. 3 is a circuit diagram illustrating a differential amplifier type limiter of a second example of the limiter 12 of FIG. 1.

Each amplifier of the limiter 12 is a CMOS (Complementary Metal Oxide Semiconductor) type single-layer amplifier as illustrated in FIG. 2 or a CMOS type differential amplifier as illustrated in FIG. 3. Each amplifier includes at least one pair of a PMOS (Positive Metal Oxide Semiconductor) transistor and an NMOS (Negative Metal Oxide Semiconductor) transistor. The PMOS transistor and the NMOS transistor are connected to each other in a complementary manner. The PMOS transistor senses the phase component having a second-order distortion that is controlled within a predetermined range with respect to the input signal IN. The NMOS transistor senses the phase component having the same second-order distortion as the phase component sensed by the PMOS transistor. The second-order distortion depends on a square characteristic of an input voltage and an output current of the transistor when the input amplitude is changed. Because the second-order distortion of the phase component sensed by the PMOS transistor is equal to that of the phase component sensed by the NMOS transistor, both second-order distortions cancel each other. That is, when the input signal IN is converted, the limiter 12 suppresses the phase distortion such that the amplitude is kept constant.

As illustrated in FIG. 2, the single-layer amplifier includes a pair of the PMOS transistor and the NMOS transistor. In the single-layer amplifier of FIG. 2, the bias controller 13 sets bias voltages VB1 and VB2 (bias control signal BC of FIG. 1) such that the second-order distortion of the output signal of the PMOS transistor and the second-order distortion of the NMOS transistor become equal to each other. Therefore, an output current $I_{OUT}$ (phase signal PH of FIG. 1) is output from an output terminal OUTPUT according to an input voltage Vg (input signal IN of FIG. 1 or modulation signal MS of FIG. 5) supplied to an input terminal INPUT.

As illustrated in FIG. 3, the differential amplifier includes two pairs of the PMOS transistors and the NMOS transistors. In the differential amplifier of FIG. 3, the bias controller 13 sets the bias voltages VB1 and VB2 (bias control signal BC of FIG. 1) such that the second-order distortion of the PMOS transistor and the second-order distortion of the NMOS transistor become equal to each other. Therefore, the output current $I_{OUT}(+)$ (phase signal PH of FIG. 1) is output from the output terminal OUTPUT(+) according to the input voltage Vg(+) (input signal IN of FIG. 1 or modulation signal MS of FIG. 5) supplied to the input terminal INPUT(+), and the output current $I_{OUT}(-)$ (phase signal PH of FIG. 1) is output from the output terminal OUTPUT(-) according to the input voltage Vg(-) (input signal IN of FIG. 1 or modulation signal MS of FIG. 5) supplied to the input terminal INPUT(-). The magnitude of the input voltage Vg(+) is equal to that of the input voltage Vg(-). The magnitude of the output current $I_{OUT}(+)$ is equal to that of the output current $T_{OUT}(-)$.

Gate lengths and gate widths of the PMOS transistor and NMOS transistor of the limiter 12 will be explained below.

An output current In of the NMOS transistor in a saturated region is expressed by an equation 1. In the equation 1, Vg is an input voltage, Wn is a gate width of the NMOS transistor, Ln is a gate length of the NMOS transistor, Kn is a proportional constant determined by a structure and a material (for example, capacitance of gate oxide film) of the NMOS transistor, and Vthn is a threshold voltage of the NMOS transistor.

$$In = Kn \frac{Wn}{Ln}(Vg - Vthn)^2 \quad \text{(equation 1)}$$

An output current Ip of the PMOS transistor in the saturated region is expressed by an equation 2. In the equation 2, Vdd is a power supply voltage, Wp is a gate width of the PMOS transistor, Lp is a gate length of the PMOS transistor, Kp is a proportional constant of the PMOS transistor, and Vthp is a threshold voltage of the PMOS transistor.

$$Ip = Kp \frac{Wp}{Lp}(Vdd - Vg - Vthp)^2 \quad \text{(equation 2)}$$

The output current Iout is expressed from the equations 1 and 2 by an equation 3.

$$Iout = Ip - In \quad \text{(equation 3)}$$

As is clear from the equation 3, a term of "$Vg^2$" expressing the second-order distortion becomes zero when the second-order distortion of the output current Ip of the PMOS transistor is equal to the second-order distortion of the output current In of the NMOS transistor. Accordingly, gate sizes of the PMOS transistor and NMOS transistor are determined such that the equation 4 holds.

$$Kp \frac{Wp}{Lp} = Kn \frac{Wn}{Ln} \quad \text{(equation 4)}$$

That is, the gate width and gate length (hereinafter referred to as "gate size") of the PMOS transistor and the gate size of the NMOS transistor are determined such that the second-order distortion of the output current Ip of the PMOS transistor becomes equal to the second-order distortion of the output current In of the NMOS transistor. Therefore, a degree of AM-PM conversion is considerably reduced.

Figure 4:
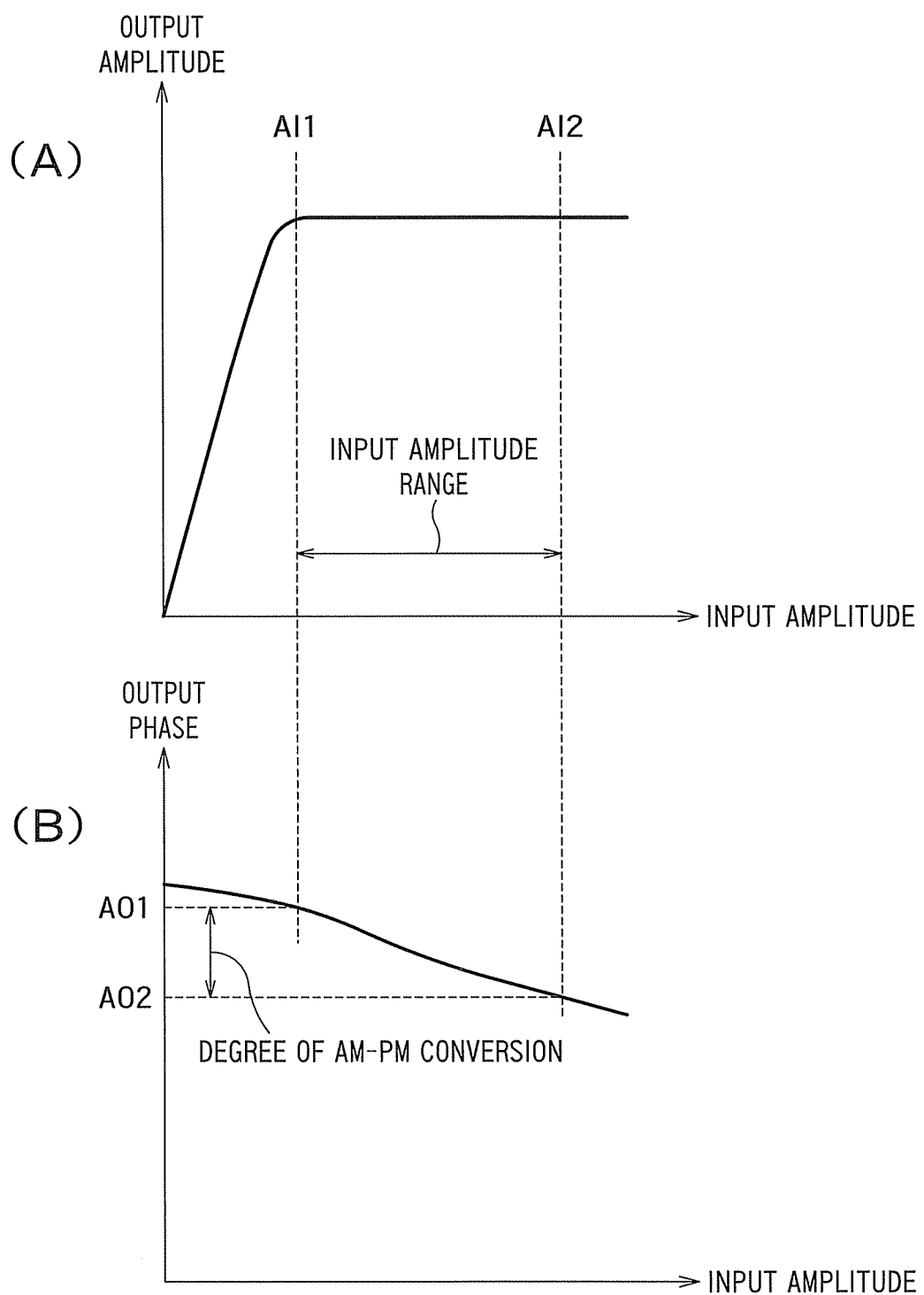
FIG. 4 is a graph illustrating a relationship between the input amplitude and the output amplitude, and a relationship between the input amplitude and the output phase.

A characteristic of the limiter 12 of FIG. 1 will be explained. FIG. 4 is a graph illustrating a relationship between the input amplitude and the output amplitude, and a relationship between the input amplitude and the output phase.

When the input amplitude range of the semiconductor integrated circuit including the power amplifier 10 ranges from a first amplitude AI1 to a second amplitude AI2, in a range in which the input amplitude exceeds the first amplitude AI1, the amplitude (hereinafter referred to as "output amplitude") of the phase signal PH is kept constant (see (A) of FIG. 4) while the output phase decreases (see (B) of FIG. 4). That is, in the input amplitude range, the output amplitude is kept constant while the output phase decreases. As a result, a difference occurs between a first output phase PO1 corresponding to the first amplitude AI1 and a second output phase PO2 corresponding to the second amplitude AI2. The difference is the degree of AM-PM conversion. The degree of AM-PM conversion increases with decreasing input amplitude and decreases with increasing input amplitude. For example, in order to deal with a 16-QAM (Quadrature Amplitude Modulation) signal or 64-QAM signal of the OFDM system, it is necessary to set the input amplitude range to 40 dB and the degree of AM-PM conversion to three degrees or less.

Figure 5:
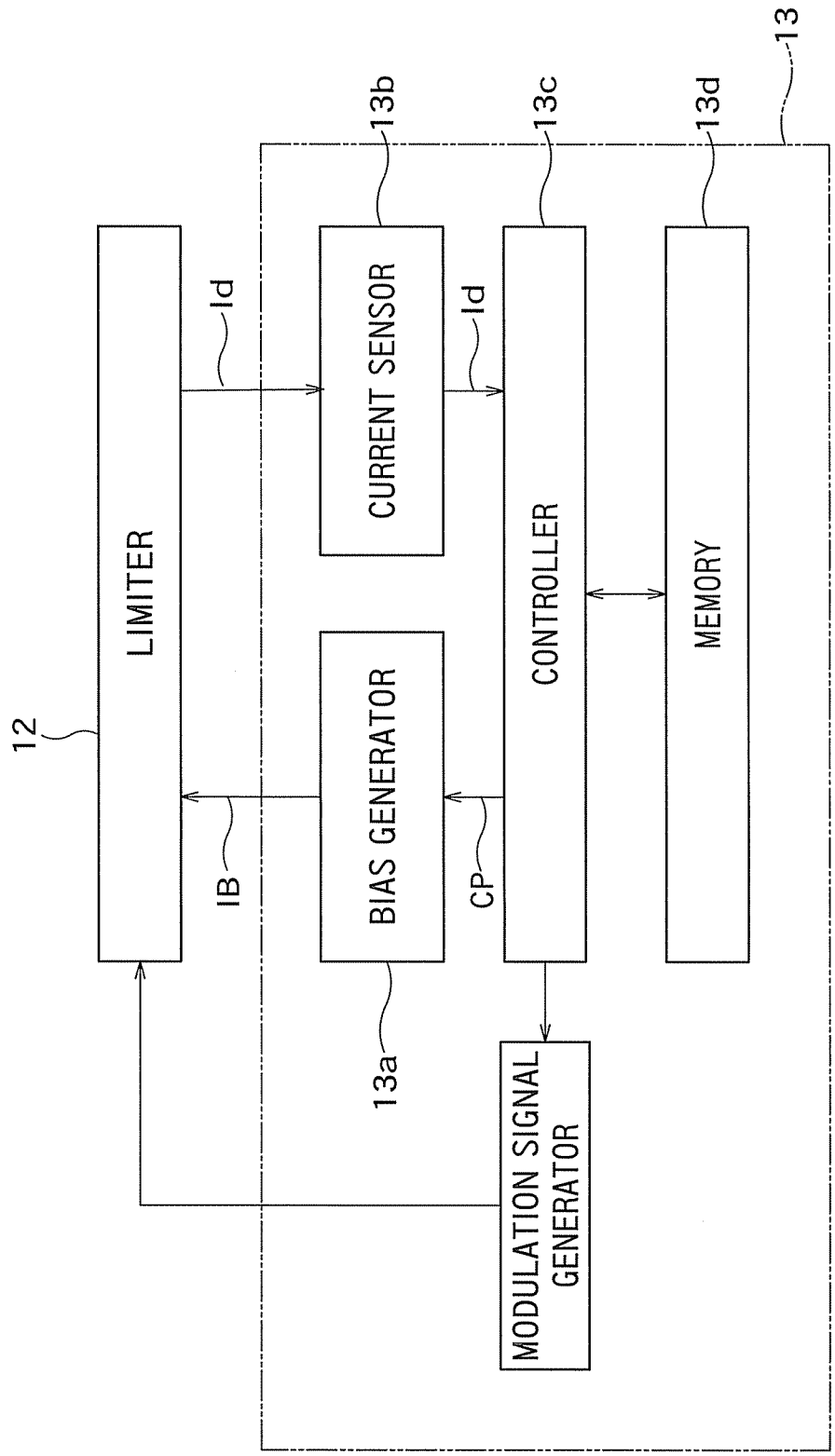
FIG. 5 is a block diagram illustrating a configuration of the first example of the bias controller 13 of FIG. 1.
Figure 6:
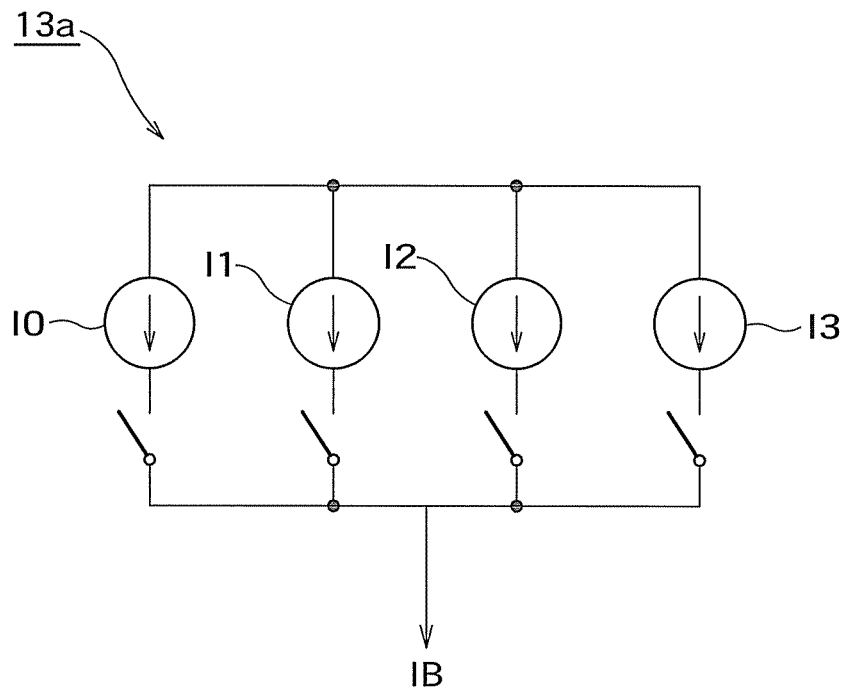
FIG. 6 is a block diagram illustrating an example of a configuration of a bias generator 13a of FIG. 5.
Figure 7:
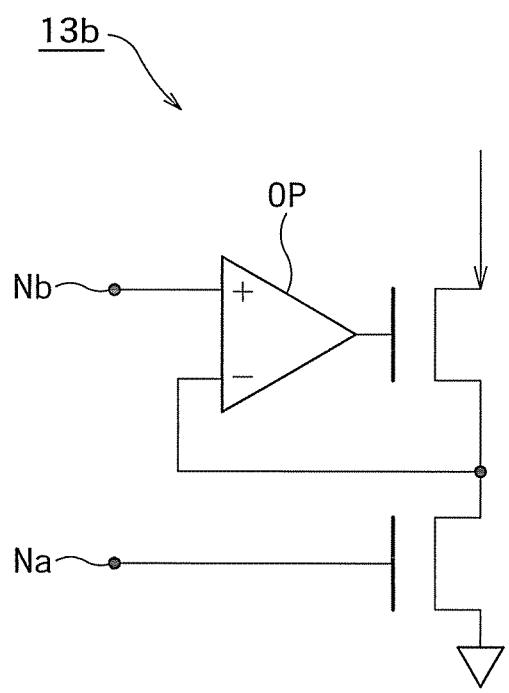
FIG. 7 is a block diagram illustrating an example of a configuration of a current sensor 13b of FIG. 5.

A first example of the bias controller 13 of FIG. 1 will be explained. FIG. 5 is a block diagram illustrating a configuration of the first example of the bias controller 13 of FIG. 1. FIG. 6 is a block diagram illustrating an example of a configuration of a bias generator 13a of FIG. 5. FIG. 7 is a block diagram illustrating an example of a configuration of a current sensor 13b of FIG. 5.

Referring to FIG. 5, the bias controller 13 includes the bias generator 13a, the current sensor 13b, a controller 13c, a memory 13d, and a modulation signal generator 13e.

The bias generator 13a of FIG. 5 generates a bias current IB (bias control signal BC of FIG. 1) of the limiter 12 based on a predetermined control parameter CP. Referring to FIG. 6, the bias generator 13a includes four current sources I0 to I3. The bias generator 13a selects one of the current sources I0 to I3 based on the control parameter CP. The currents generated by the current sources I0 to I3 are different from one another. For example, a current IB0 is generated by the first current source I0, a current 2IB0 is generated by a second current source I1, a current 3IB0 is generated by the third current source I2, and a current 4IB0 is generated by the fourth current source I3. In the embodiment, the number of the current sources of the bias generator 13a is not limited to four. The bias generator 13a may include at least the two current sources.

The current sensor 13b of FIG. 5 senses an operating current Id of the limiter 12. As illustrated in FIG. 7, the current sensor 13b is a current sensing circuit in which a current mirror is used. A positive terminal of an operational amplifier OP of the current sensor 13b is connected to a node Nb illustrated in FIG. 2 or FIG. 3. As illustrated in FIG. 2 or FIG. 3, the NMOS transistor of the limiter 12 is connected to the node Nb. A negative terminal of the operational amplifier OP of the current sensor 13b is connected to a node Na illustrated in FIG. 3 or FIG. 5. As illustrated in FIG. 2 or FIG. 3, the bias voltage VB1 is applied to the node Na.

The controller 13c of FIG. 5 converts an analog signal indicating the operating current Id sensed by the current sensor 13b into a digital signal, and generates a control parameter CP and a control signal CS based on the digital signal. The generated control parameter CP is supplied to the bias generator 13a. Therefore, the bias current IB of the limiter 12 changes according to the operating current Id of the limiter 12. The generated control signal CS is supplied to the modulation signal generator 13e. Therefore, a signal level of the modulation signal MS (bias control signal BC of FIG. 1) is controlled. The modulation signal MS is a sample signal when the bias controller 13 operates. That is, the bias controller 13 generates the bias current IB based on the operating current Id of the limiter 12 when the modulation signal MS is supplied.

The memory 13d of FIG. 5 is capable of storing data necessary to control the bias current IB. That is, the memory 13d is a working memory for the controller 13c.

The modulation signal generator 13e of FIG. 5 generates the modulation signal MS having the predetermined signal level based on the control signal CS generated by the controller 13c.

In other words, in the first example of the bias controller 13, the bias current IB of the limiter 12 is controlled by digital signal processing.

Figure 8:
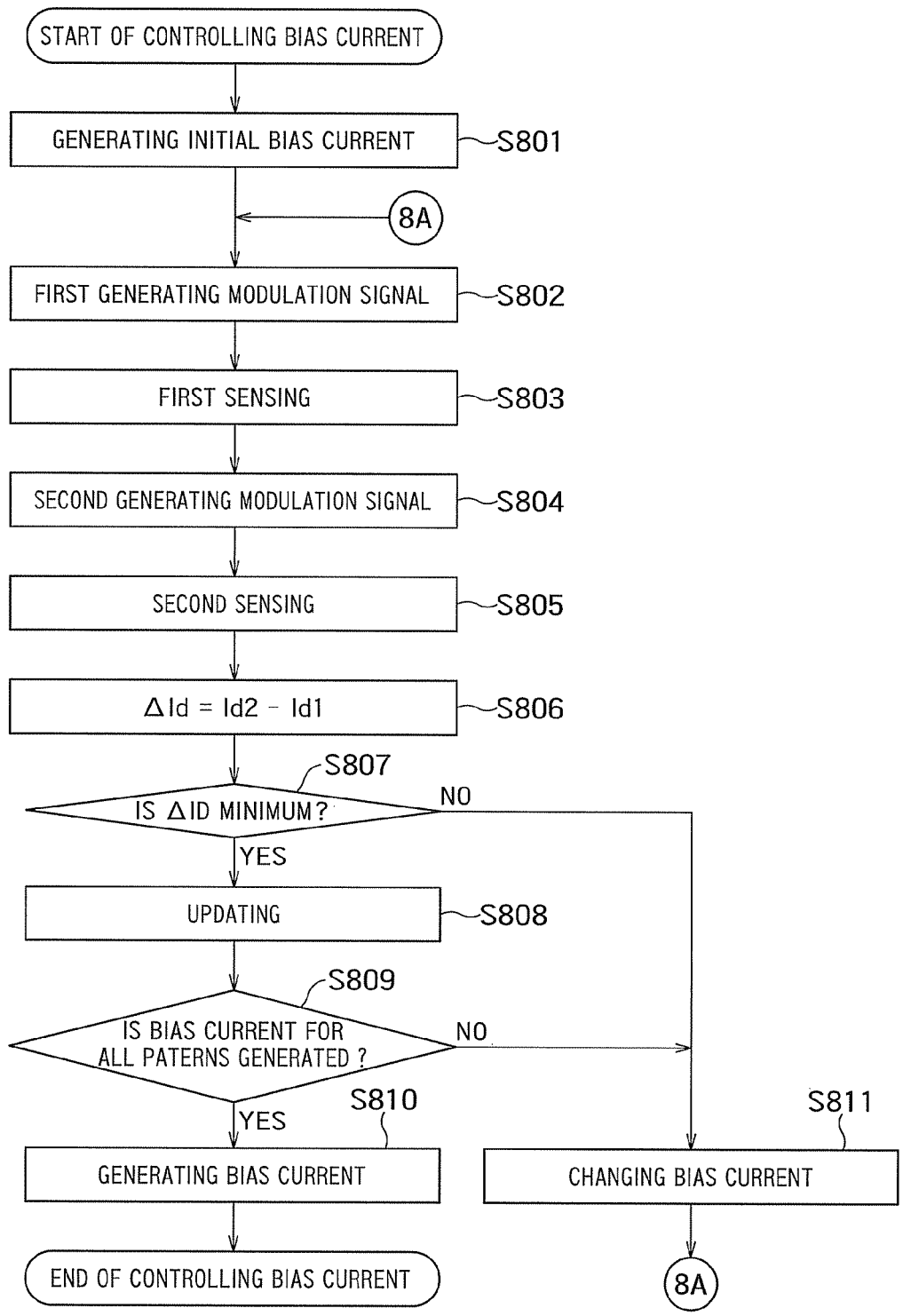
FIG. 8 is a flowchart illustrating a procedure of bias control performed by the bias controller 13 of FIG. 5.

Processing performed by the bias controller 13 of FIG. 5 will be explained. FIG. 8 is a flowchart illustrating a procedure of bias control performed by the bias controller 13 of FIG. 5.

<FIG. 8: Generating Initial Bias Current (S801)>

The controller 13c generates the initial control parameter CP in order to generate the initial bias current IB. Then the bias generator 13a generates the initial bias current IB based on the initial control parameter CP, thereby supplying the initial bias current IB to the limiter 12. For example, the controller 13c generates the initial control parameter CP in order to generate the first bias current IB0 of the first current source I0 as the initial bias current IB. Then the first current source I0 is activated based on the control parameter CP, thereby supplying the first bias current IB0 to the limiter 12.

<FIG. 8: First Generating Modulation Signal (S802)>

The controller 13c generates a first control signal CS1 in order to generate a first modulation signal MS1 having a first signal level lower than a predetermined average level. The average level is supplied from a predetermined circuit connected to the power amplifier 10. Then the modulation signal generator 13e generates the first modulation signal MS1 based on the first control signal CS1, thereby supplying the first modulation signal MS1 to the limiter 12. In the first-time first generating modulation signal (S802), the controller 13c generates the first modulation signal MS1 having the first signal level lower than a predetermined reference level.

<FIG. 8: First Sensing (S803)>

The current sensor 13b senses a first operating current Id1 of the limiter 12 according to the first signal level. Then the controller 13c writes the first operating current Id1 sensed by the limiter 12 in the memory 13d. Therefore, the first operating current Id1 corresponding to the first signal level is stored in the memory 13d.

<FIG. 8: Second Generating Modulation Signal (S804)>

The controller 13c generates a second control signal CS2 in order to generate a second modulation signal MS2 having a second signal level higher than the average signal level. Then the modulation signal generator 13e generates the second modulation signal MS2 based on the second control signal CS2, thereby supplying the second modulation signal MS2 to the limiter 12. In the first-time second generating modulation signal (S804), the controller 13c generates the second modulation signal MS2 having the second signal level higher than the reference level.

<FIG. 8: Second Sensing (S805)>

The current sensor 13b senses a second operating current 1d2 corresponding to the second signal level.

<FIG. 8: S806>

The controller 13c calculates a difference (hereinafter referred to as "operating current difference") ΔId between the second operating current Id2 and the first operating current Id1. More specifically, the controller 13c subtracts the first operating current Id1 stored in the memory 13d in the first sensing (S803) from the second operating current 1d2 sensed in the second sensing (S805), thereby the operating current difference ΔId is calculated.

<FIG. 8: S807>

The controller 13c determines whether the operating current difference ΔId is the minimum. When the operating current difference ΔId is the minimum (YES in S807), the flow goes to updating (S808). When the operating current difference is not the minimum (NO in S807) the flow goes to changing bias current (S811). More specifically, the controller 13c compares the operating current difference ΔId calculated in S806 and a minimum operating current difference stored in the memory 13d. The flow goes to the updating (S808) when the operating current difference ΔId is lower than the minimum operating current difference. The flow goes to the changing bias current (S811) when the operating current difference ΔId is not lower than the minimum operating current difference. The flow always goes to the updating (S808) because the minimum operating current difference is not stored in the memory 13d in the first-time S807.

<FIG. 8: Updating (S808)>

The controller 13c writes the operating current difference ΔId calculated in S806 in the memory 13d as the minimum operating current difference. Therefore, the minimum value of the operating current difference ΔId is always stored in the memory 13d.

<FIG. 8: S809>

The controller 13c determines whether the operating currents Id corresponding to the bias currents for all patterns are sensed. When the operating currents Id corresponding to the bias currents for all patterns are sensed (YES in S809), the flow goes to generating bias current (S810). When the operating currents Id corresponding to the bias currents for all patterns are not sensed (NO in S809), the flow goes to the changing bias current (S811). For example, when the four operating currents Id corresponding to the first to fourth bias currents IB0 to IB3 of FIG. 6 are sensed, the flow goes to the generating bias current (S810).

<FIG. 8: Generating Bias Current (S810)>

The controller 13c generates the control parameter CP in order to generate the bias current IB corresponding to the minimum operating current difference stored in the memory 13d. Then the bias generator 13a generates the bias current IB based on the control parameter CP. Therefore, the bias current IB in which the operating current difference ΔId becomes the minimum is supplied to the limiter 12.

<FIG. 8: Changing Bias Current (S811)>

The controller 13c generates the control parameter CP in order to change the bias current IB. Then the bias generator 13a changes the bias current IB. More specifically, the controller 13c generates the control parameter CP in order to change the current source of the bias generator 13a. Then the bias generator 13a changes the current source based on the control parameter CP. For example, as illustrated in FIG. 6, the bias generator 13a activates the first current source I0 in the GENERATING INITIAL BIAS CURRENT (S801), activates the second current source I1 in the first-time changing bias current (S811), activates the third current source I2 in the second-time changing bias current (S811), and activates the fourth current source I3 in the third-time changing bias current (S811).

The bias control of FIG. 8 is ended after the generating bias current (S810).

In the embodiment, the bias control of FIG. 8 is performed with the memory 13d by way of example. However, the scope of the invention is not limited to the embodiment. For example, the invention can also be applied to the case where the bias control of FIG. 8 is performed with at least two sets of resistors, switches, and capacitors instead of the memory 13d.

Figure 9:
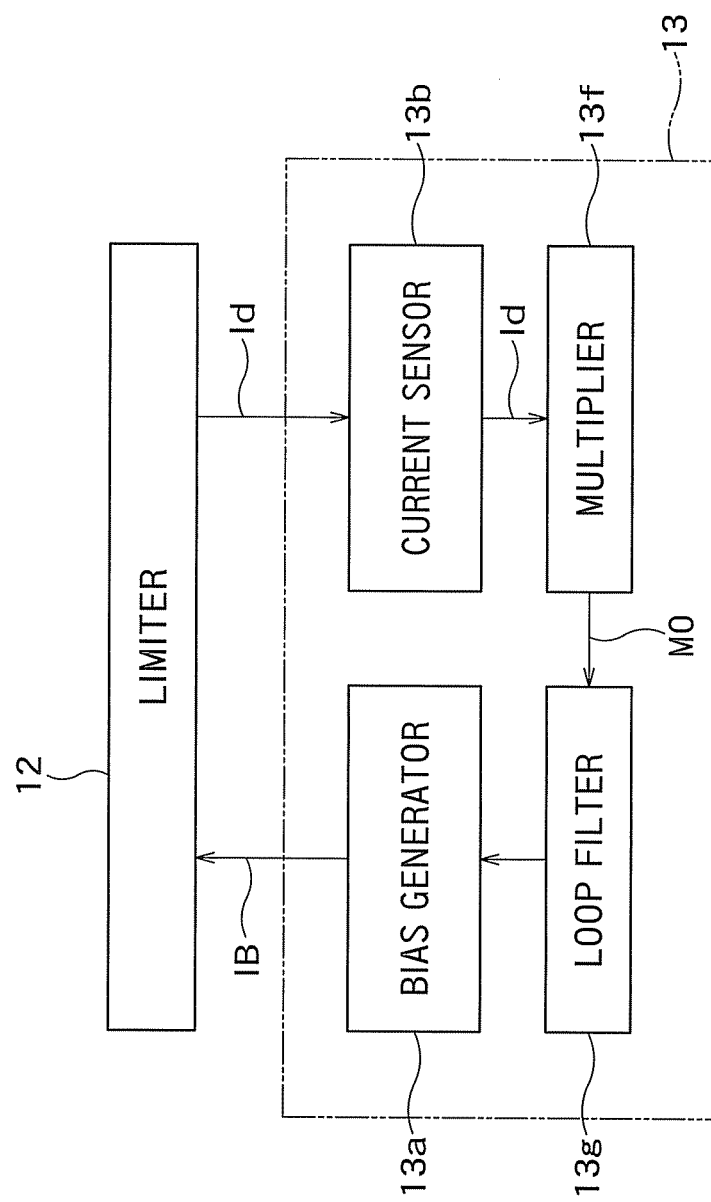
FIG. 9 is a block diagram illustrating the second example of the configuration of the bias controller 13 of FIG. 1.

A second example of the bias controller 13 of the embodiment will be explained below. FIG. 9 is a block diagram illustrating the second example of the configuration of the bias controller 13 of FIG. 1.

Referring to FIG. 9, the bias controller 13 includes the bias generator 13a, the current sensor 13b, a multiplier 13f, and a loop filter 13g. The current sensor 13b is similar to the current sensor 13b of FIG. 5.

The bias generator 13a of FIG. 9 generates the bias current IB (bias control signal BC of FIG. 1) of the limiter 12 based on a product calculated by the multiplier 13f. Referring to FIG. 6, the bias generator 13a includes the four current sources I0 to I3. The bias generator 13a selects one of the current sources I0 to I3 based on the product calculated by the multiplier 13f.

The multiplier 13f of FIG. 9 calculates the product of the envelope component sensed by the envelope detector 11 and the operating current Id sensed by the current sensor 13b. For example, an output signal MO of the multiplier 13f is a voltage signal expressing the product of the envelope component and the operating current Id.

The loop filter 13g of FIG. 9 smoothes the output signal MO of the multiplier 13f. The smoothed output signal is supplied to the bias generator 13a. Therefore, the bias current IB of the limiter 12 changes according to the operating current Id of the limiter 12. In the embodiment, the loop filter 13g may be omitted. In such cases, the output signal MO of the multiplier 13f is supplied to the bias generator 13a.

In other words, in the second example of the bias controller 13, the bias current IB of the limiter 12 is controlled by analog signal processing.

Figure 10:
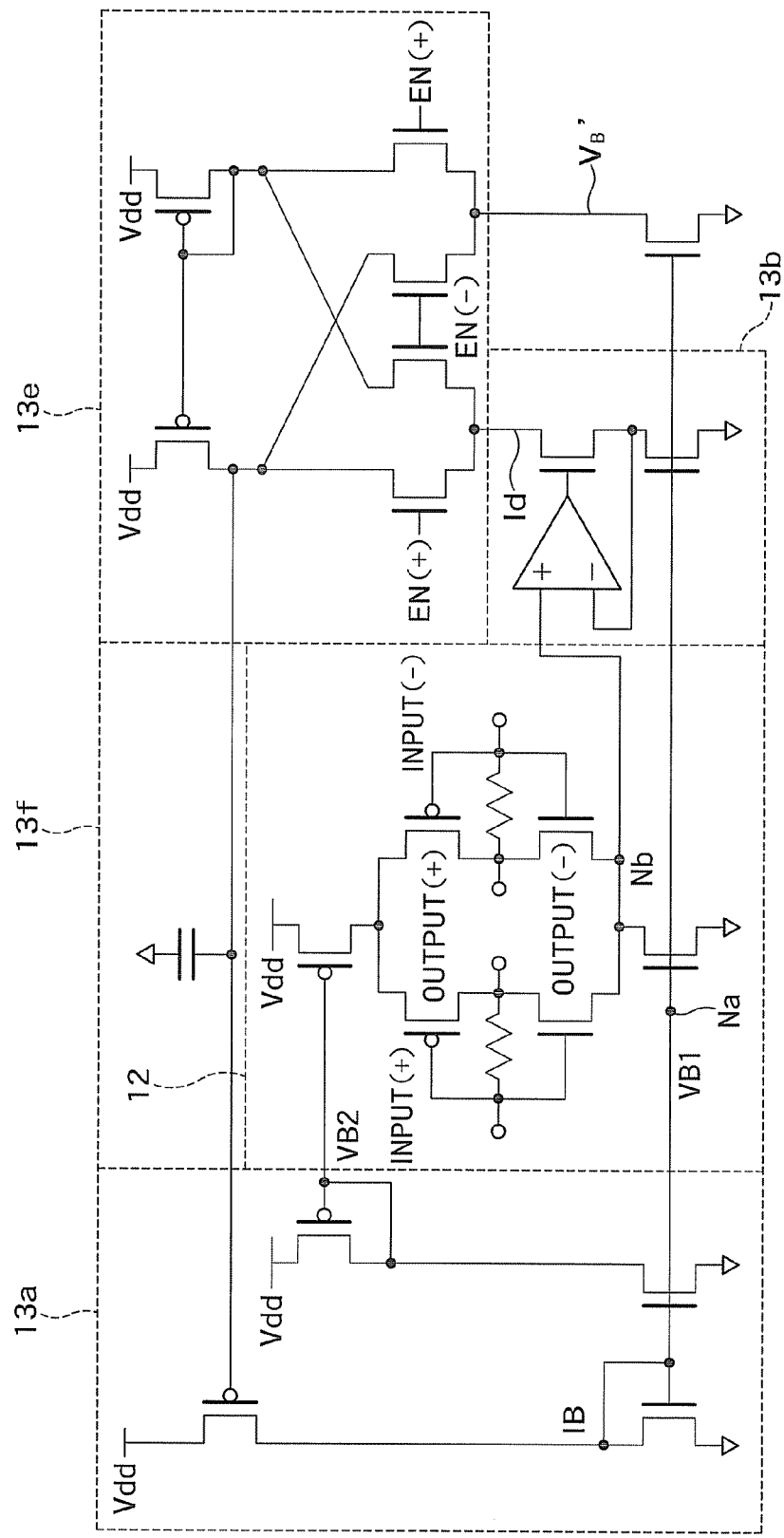
FIG. 10 is a circuit diagram of the bias controller 13 of FIG. 9.

A specific example of the second example of the bias controller 13 of the embodiment will be explained. FIG. 10 is a circuit diagram of the bias controller 13 of FIG. 9.

The RF input signal IN of FIG. 10 is expressed by an equation 5. In the equation 5, $V_1(t)$ is an envelope signal and $\omega_{rf}$ is a carrier frequency.

$$IN = V_1(t) * \sin(\omega_{rf} t + \phi(t)) \quad \text{(equation 5)}$$

The envelope component EN(+) of FIG. 10 is expressed by an equation 6. In the equation 6, Vdc is a bias potential and $A_0$ is a gain of the envelope detector.

$$EN(+) = Vdc + A_0 * V_1(t) \quad \text{(equation 6)}$$

The operating current Id sensed by the current sensor 13b of FIG. 10 is expressed by an equation 7. In the equation 7, Idc is a bias current of the multiplier 13f and $A_1$ is a degree of AM-PM conversion generated by the second-order distortion of each amplifier of the limiter 12.

$$Id = Idc + A_1 * V_1(t) \quad \text{(equation 7)}$$

A bias voltage VB' for a multiplier is applied to the multiplier 13f of FIG. 10. The multiplier 13f calculates the product (EN(+)*Id) of the operating current Id expressed by the equation 7 and the envelope component EN(+) expressed by the equation 6.

The loop filter 13g of FIG. 10 averages the products calculated by the multiplier 13f, thereby the degree of AM-PM conversion $A_1$ of each amplifier of the limiter 12 is calculated.

The bias current IB of FIG. 10 is expressed by an equation 8. In the equation 8, K is an open gain of a feedback loop. That is, the bias current IB depends on the degree of AM-PM conversion $A_1$. In other words, the bias current IB is fed back such that the degree of AM-PM conversion $A_1$ decreases. More specifically, in the circuit of FIG. 10, the bias current IB and the bias current Idc of the multiplier are equalized by the current mirror. Accordingly, the degree of AM-PM conversion $A_1$ decreases with increasing open gain K of the feedback loop. In other words, the open gain K of the feedback loop is inversely proportional to the degree of AM-PM conversion $A_1$.

$$IB = Idc - K * A_1 \quad \text{(equation 8)}$$

The circuit of FIG. 10 is implemented by one chip. In other words, the bias controller 13 is integrated in the same chip as the limiter 12.

Figure 11:
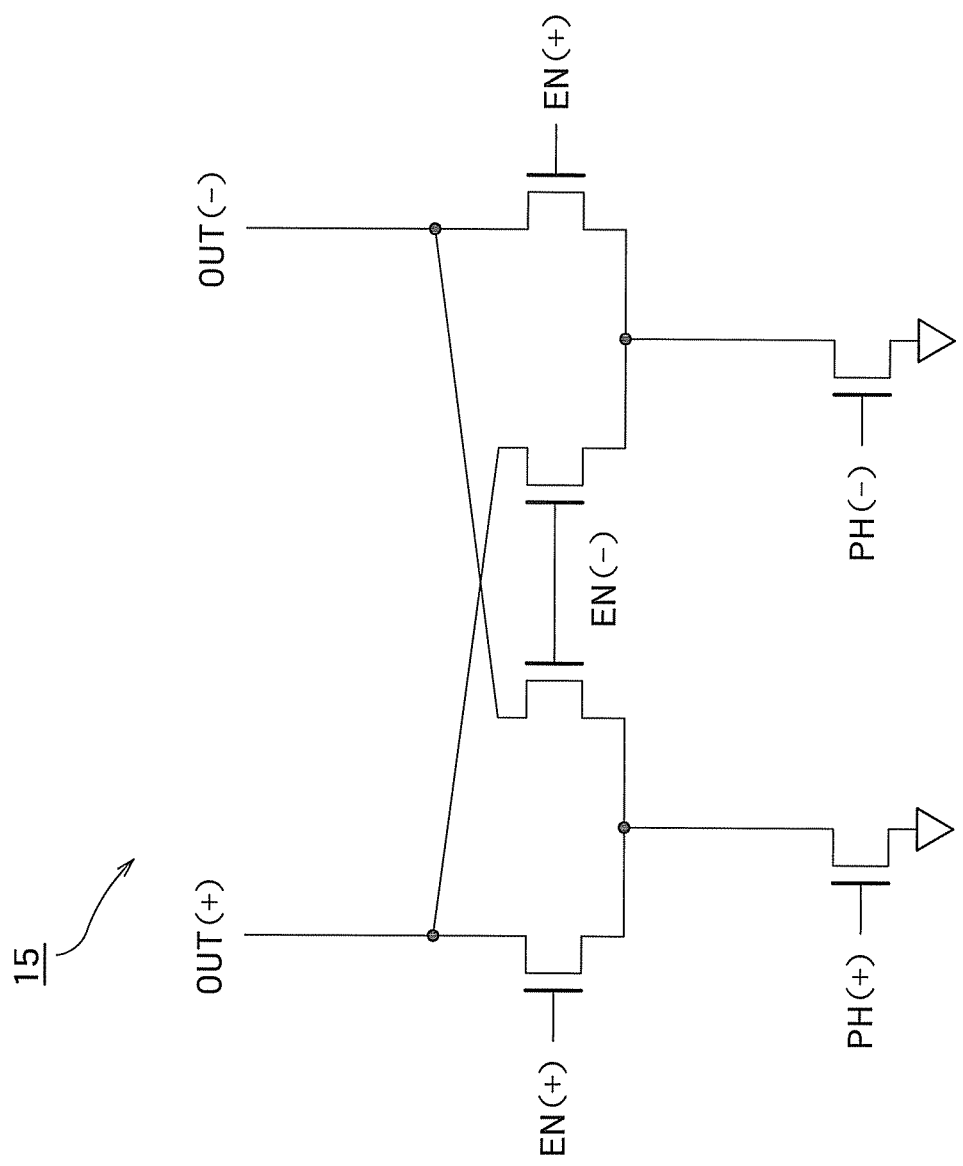
FIG. 11 is a circuit diagram of the combiner 14 FIG. 1.

The combiner 14 of FIG. 1 will be explained. FIG. 11 is a circuit diagram of the combiner 14 FIG. 1.

As illustrated in FIG. 11, the combiner 14 generates the RF output signal OUT. In the RF output signal OUT, the amplitude depends on an EN signal, and the phase depends on a PH signal.

Figure 12:
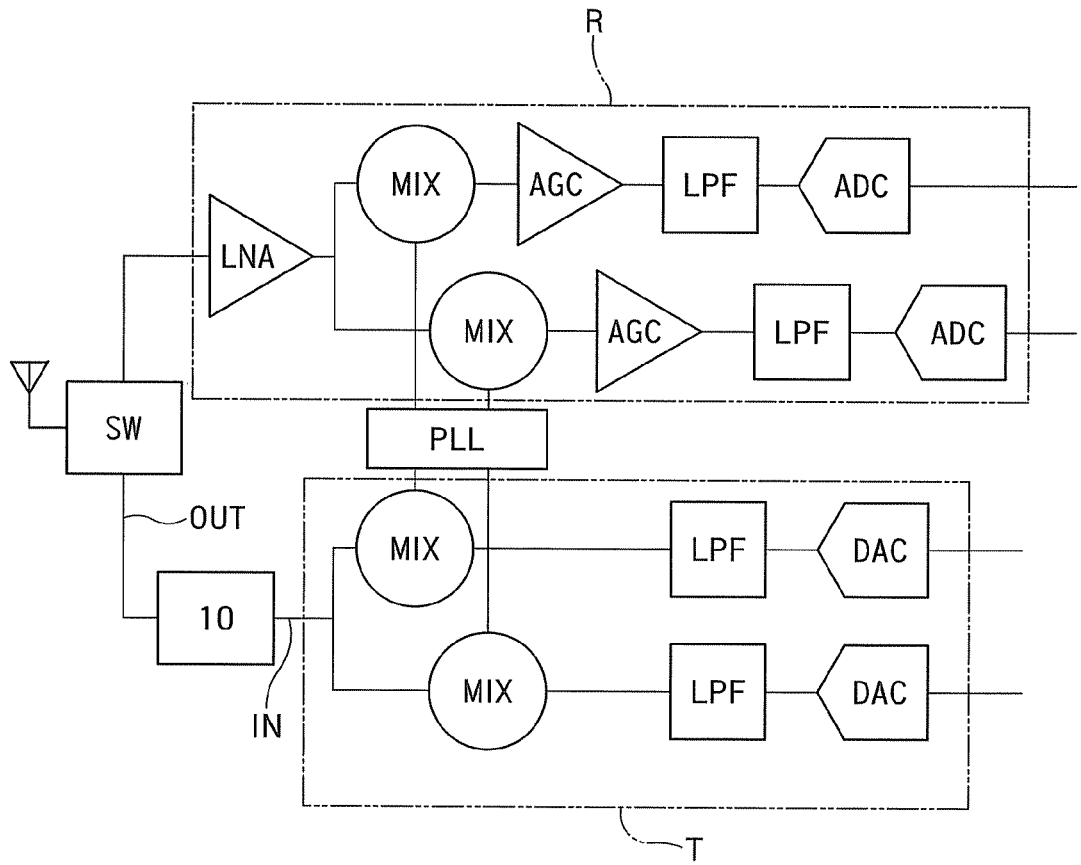
FIG. 12 is a block diagram illustrating a configuration of a transceiver including the power amplifier 10 of FIG. 1.

An application example of the power amplifier 10 of the embodiment will be explained. FIG. 12 is a block diagram illustrating a configuration of a transceiver including the power amplifier 10 of FIG. 1.

As illustrated in FIG. 12, the power amplifier 10 is incorporated in a transceiver (semiconductor integrated circuit) in which the OFDM system is adopted. For example, the transceiver is provided in a so-called fourth-generation cellular phone, a wireless LAN (Local Area Network), and a cellular phone or a computer in which WiMAX (Worldwide. Interoperability for Microwave Access) is adopted.

Referring to FIG. 12, the transceiver includes a receiving unit R, a transmitting unit T, a switch SW, and a phase lock circuit PLL.

The receiving unit R includes a low-noise amplifier LNA, a pair of mixers MIX, a pair of automatic gain controllers AGC, a pair of low-pass filters LPF, and a pair of analog-digital converters ADC.

The transmitting unit T includes the power amplifier 10 of the embodiment, a pair of mixers MIX, a pair of low-pass filters LPF, and a pair of analog-digital converters DAC.

The switch SW and the phase lock circuit PLL are provided between the receiving unit R and the transmitting unit T.

The pair of mixers MIX of the transmitting unit T generates an RF input signal IN input to the power amplifier 10. An RF output signal OUT output from the power amplifier 10 is supplied to the switch SW. The degree of AM-PM conversion is reduced in the RF output signal OUT.

In the embodiment, the gate sizes of the PMOS transistor and NMOS transistor are determined such that the second-order distortion of the phase signal PH output by the PMOS transistor becomes equal to the second-order distortion of the phase signal PH output by the NMOS transistor. Therefore, the degree of AM-PM conversion is considerably reduced. As a result, the application range of the EER system spreads. More specifically, the EER system can be applied to the radio communication device in which the OFDM system is adopted.

The bias controller 13 that controls the bias current of the limiter is provided in the embodiment. Therefore, the degree of AM-PM conversion can be reduced in consideration of not only static factors such as a process variation but also dynamic factors such as an operating temperature of the power amplifier 10. That is, a reduction amount of the degree of AM-PM conversion can be stabilized.

In the embodiment, the bias controller 13 may control the bias current IB of the limiter 12 through the digital signal processing. In such cases, the stable bias control processing can be realized.

In the embodiment, the bias controller 13 may control the bias current IB of the limiter 12 through the analog signal processing. In such cases, the high-speed bias control processing can be realized, and the bias controller 13 can be shrunk.

In the embodiment, the bias generator 13a generates the bias current IB as the bias control signal BC. However, the scope of the invention is not limited to the embodiment. The invention can also be applied to the case where the bias generator 13a generates the bias voltage as the bias control signal BC.

At least a portion of the power amplifier 10 according to the above-described embodiments may be composed of hardware or software. When at least a portion of the * is composed of software, a program for executing at least some functions of the power amplifier 10** may be stored in a recording medium, such as a flexible disk or a CD-ROM, and a computer may read and execute the program. The recording medium is not limited to a removable recording medium, such as a magnetic disk or an optical disk, but it may be a fixed recording medium, such as a hard disk or a memory.

In addition, the program for executing at least some functions of the power amplifier 10 according to the above-described embodiment may be distributed through a communication line (which includes wireless communication) such as the Internet. In addition, the program may be encoded, modulated, or compressed and then distributed by wired communication or wireless communication such as the Internet. Alternatively, the program may be stored in a recording medium, and the recording medium having the program stored therein may be distributed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A power amplifier comprising:
an envelope detector configured to sense an envelope component of an input signal;
a limiter comprising a PMOS (Positive channel Metal Oxide Semiconductor) transistor configured to sense a first phase component of the input signal and an NMOS (Negative channel Metal Oxide Semiconductor) transistor configured to sense a second phase component of the input signal, the first phase component having a first second-order distortion controlled within a predetermined range with respect to the input signal, the second phase component having a second second-order distortion;
a combiner configured to combine the envelope component sensed by the envelope detector and the phase component sensed by the limiter to generate an output signal; and
a bias controller configured to control a bias of the limiter to cancel the first second-order distortion by the second second-order distortion, the bias controller comprising a current sensor configured to sense an operating current of the limiter, a controller configured to convert an analog signal indicating the operating current sensed by the current sensor into a digital signal and generate a control parameter based on the digital signal, and a bias generator configured to generate a bias current or a bias voltage based on the control parameter.

2. The amplifier of claim 1, wherein the controller comprises a memory capable of storing data, writes a first operating current sensed by the current sensor to the memory, generating the control parameter for changing the bias current, calculates an operating current difference between a second operating current corresponding to the bias current generated based on the control parameter and the first operating current stored in the memory when the second operating current is sensed by the current sensor, and generates the control parameter for generating the bias current corresponding to a minimum value of the operating current difference.

3. The amplifier of claim 1, wherein the bias controller comprises:
a multiplier configured to calculate a product of the envelope component sensed by the envelope detector and the operating current sensed by the current sensor, wherein the bias generator generates the bias current or the bias voltage based on the product calculated by the multiplier.

4. A semiconductor integrated circuit comprising:
a power amplifier comprising:
an envelope detector configured to sense an envelope component of an input signal;
a limiter comprising a PMOS (Positive channel Metal Oxide Semiconductor) transistor configured to sense a first phase component of the input signal and an NMOS (Negative channel Metal Oxide Semiconductor) transistor configured to sense a second phase component of the input signal, the first phase component having a first second-order distortion controlled within a predetermined range with respect to the input signal, the second phase component having a second second-order distortion;

a combiner configured to combine the envelope component sensed by the envelope detector and the phase component sensed by the limiter to generate an output signal;

a bias controller configured to control a bias of the limiter to cancel the first second-order distortion by the second second-order distortion, the bias controller comprising a current sensor configured to sense an operating current of the limiter, a controller configured to convert an analog signal indicating the operating current sensed by the current sensor into a digital signal and generate a control parameter based on the digital signal, and a bias generator configured to generate a bias current or a bias voltage based on the control parameter; and a transceiver configured to send and receive a radio frequency signal based on an output signal of the power amplifier.

5. The circuit of claim 4, wherein the controller comprises a memory capable of storing data, writes a first operating current sensed by the current sensor to the memory, generating the control parameter for changing the bias current, calculates an operating current difference between a second operating current corresponding to the bias current generated based on the control parameter and the first operating current stored in the memory when the second operating current is sensed by the current sensor, and generates the control parameter for generating the bias current corresponding to a minimum value of the operating current difference.

6. The circuit of claim 4, wherein the bias controller comprises:
- a multiplier configured to calculate a product of the envelope component sensed by the envelope detector and the operating current sensed by the current sensor
wherein the bias generator generates the bias current or the bias voltage based on the product calculated by the multiplier.

7. The circuit of claim 4, the transceiver adopts OFDM (Orthogonal Frequency Division Multiplexing) system.

* * * * *